(12) United States Patent
Gardner et al.

(10) Patent No.: US 6,261,909 B1
(45) Date of Patent: Jul. 17, 2001

(54) SEMICONDUCTOR DEVICE HAVING ULTRA SHALLOW JUNCTIONS AND A REDUCED CHANNEL LENGTH AND METHOD FOR MAKING SAME

(75) Inventors: Mark I. Gardner, Cedar Creek; H. Jim Fulford, Austin, both of TX (US); Charles E. May, Gresham, OR (US)

(73) Assignee: Advanced Micron Devices, Inc., Austin, TX (US)

( * ) Notice: Subject to any disclaimer, the term of this patent is extended or adjusted under 35 U.S.C. 154(b) by 0 days.

(21) Appl. No.: 09/225,389

(22) Filed: Jan. 5, 1999

(51) Int. Cl.[7] .................................................. H01L 21/336
(52) U.S. Cl. ........................................... 438/297; 438/270
(58) Field of Search ..................................... 438/270, 299, 438/300, 304, 430, 576, 582, 655, 425, 225, 297, 452, 301, 306, 424, 290, 653, 627, 524, 439

(56) References Cited

U.S. PATENT DOCUMENTS

| | | | |
|---|---|---|---|
| 5,908,313 | * 6/1999 | Chau et al. | 438/299 |
| 5,963,800 | * 10/1999 | Augusto | 438/212 |
| 6,096,641 | * 8/2000 | Kunikiyo | 438/653 |
| 6,107,144 | * 8/2000 | Jang et al. | 438/297 |

* cited by examiner

Primary Examiner—David Nelms
Assistant Examiner—David Nhu
(74) Attorney, Agent, or Firm—Williams, Morgan & Amerson, P.C.

(57) ABSTRACT

The present invention is directed to a method of forming a transistor having very shallow junctions and a reduced channel length, and a transistor incorporating same. In general, the method comprises forming a first process layer above a semiconducting substrate, and forming a second process layer comprised of an oxidation resistant material above the first process layer. The method continues with the formation of an opening in the first and second process layers and oxidation of the substrate lying within the opening to form a third process layer. Next, a second opening is formed in the third process layer, and a plurality of sidewall spacers are formed in the second opening. The method concludes with the formation of a gate dielectric above the substrate and between the sidewall spacers, the formation of a gate conductor above the gate dielectric, and the formation of a plurality of source and drain regions in the substrate. The transistor is comprised of a recess formed in the substrate, a gate dielectric positioned above the substrate lying within the recess, the interface between said gate dielectric and said substrate being positioned beneath the surface of said substrate. The transistor further comprises a gate conductor positioned above the gate dielectric, a plurality of sidewall spacers positioned adjacent the gate conductor, and a plurality of source/drain regions formed in the substrate.

58 Claims, 5 Drawing Sheets

SEMICONDUCTOR DEVICE HAVING ULTRA SHALLOW JUNCTIONS AND A REDUCED CHANNEL LENGTH AND METHOD FOR MAKING SAME

BACKGROUND OF THE INVENTION

1. Field Of The Invention

The present invention is generally directed to the field of semiconductor processing, and, more particularly, to a method for making a semiconductor device having very shallow junctions and a short channel length.

2. Description Of The Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. The speed at which integrated circuit devices, e.g., transistors, operate may be determined, in part, by the channel length of the transistor device. All other things being equal, the smaller the channel length of the transistor, the faster the transistor will operate. Thus, there is a constant drive to reduce the channel length of transistors to increase the overall speed of the transistor, as well as integrated circuit devices incorporating such transistors.

The ability to reduce the channel length, or feature size, of modern transistors is presently limited by modern photolithography equipment and techniques. Traditionally, components of a transistor, such as the gate conductor and gate dielectric, are made by forming the appropriate process layers, e.g., silicon dioxide and polysilicon, above the surface of a semiconducting substrate, forming a layer of photoresist above the layer of polysilicon, developing and patterning the layer of photoresist to define a mask that covers what will become the gate conductor and gate oxide, and removing the portions of the polysilicon and silicon dioxide layers that extend beyond the mask through one or more etching steps.

Using the traditional photolithography techniques described above, the feature size, e.g., the width of the gate conductor, is a result of directly forming the feature size in a layer of photoresist, or other similar masking layer, above the semiconducting substrate. To achieve further reductions in the feature size of transistors, e.g. the channel length, it may be useful to develop an alternative method that will allow formation of transistors with feature sizes smaller than that achievable with current photolithography techniques.

The present invention is directed to a method of making a semiconductor device that minimizes or reduces some or all of the aforementioned problems.

SUMMARY OF THE INVENTION

The present invention is directed to a method of making a transistor having very shallow junctions and a reduced channel length, and a transistor incorporating those features. The method comprises forming a first process layer above a semiconducting substrate, forming a second process layer comprised of an oxidation resistant material above the first process layer, and defining a first opening in the first and second process layers. The method continues with the oxidation of the substrate lying within the first opening, to thereby form a third process layer, defining a second opening in the third process layer, and forming a plurality of sidewall spacers in at least the second opening. The method concludes with the formation of a gate dielectric above the surface of the substrate between the sidewall spacers, forming a gate conductor above the gate dielectric, and forming a plurality of source/drain regions in said substrate.

The transistor is comprised of a substrate having a recess formed therein, and a gate dielectric positioned above the substrate lying within the recess, the gate dielectric and the substrate defining an interface that is positioned beneath the surface of the substrate. The transistor further comprises a gate conductor positioned above the gate dielectric, a plurality of sidewall spacers positioned adjacent at least the gate conductor, and a plurality of source/drain regions formed in the substrate.

BRIEF DESCRIPTION OF THE DRAWINGS

The invention may be understood by reference to the following description taken in conjunction with the accompanying drawings, in which like reference numerals identify like elements, and in which.

Figure 1:
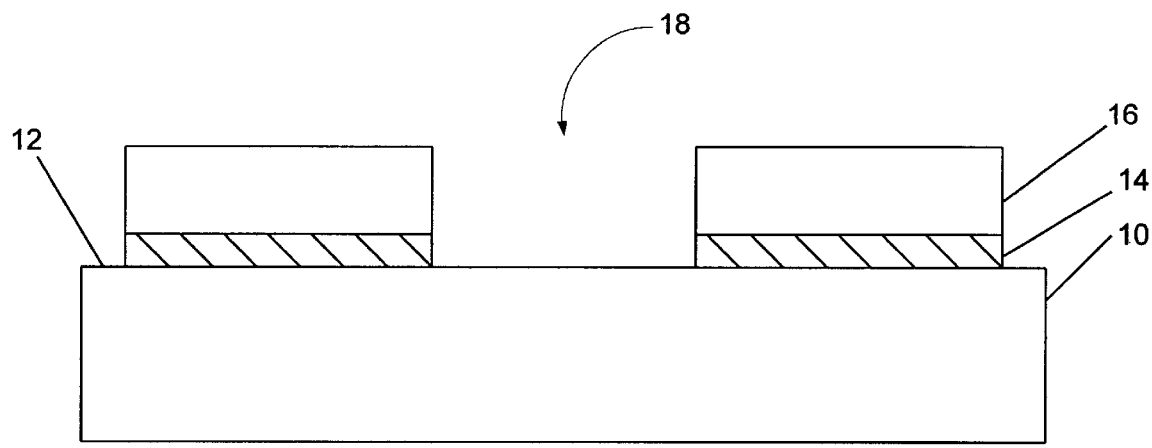
FIG. 1 is a cross-sectional view of an illustrative semiconducting substrate with a plurality of process layers formed above the substrate and an opening formed in the process layers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–9. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to the formation of a semiconductor device having very shallow junctions and a reduced channel length. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

As shown in FIG. 1, a plurality of process layers 14, 16 are formed above a surface 12 of a semiconducting substrate 10. Thereafter, the process layers 14, 16 are patterned to define an opening 18. In one illustrative embodiment, the semiconducting substrate 10 is comprised of silicon. The process layer 14 may be comprised of a variety of materials, such as, silicon dioxide, a nitrogen-bearing silicon dioxide, oxynitride, etc. In one illustrative embodiment, the process layer 14 is comprised of silicon dioxide having a thickness ranging from approximately 50–150 Å. The process layer 14 may be formed by a variety of techniques known to those skilled in the art for growing such layers, e.g., thermally growing the layer at approximately 950–1100° C. in the presence of $H_2O_2$, or a variety of deposition processes. As will be apparent upon a complete reading of the present application, the process layer 14 may be completely removed during subsequent processing operations. Thus, the particular materials selected for the process layer 14 are not critical to the present invention.

The next process involves the formation of the process layer 16. The process layer 16 may be comprised of a variety of materials that are resistant to oxidation. For example, the process layer 16 may be comprised of silicon nitride, silicon oxynitride, or other like materials. In one illustrative embodiment, the process layer 16 is comprised of silicon nitride, and the layer 16 has a thickness ranging from approximately 500–2500 Å. The layer 16 comprised of nitride may be formed by any of a variety of known techniques, including, but not limited to, plasma deposition, chemical vapor deposition (CVD), low pressure chemical vapor deposition (LPCVD), sputter deposition, etc.

The opening 18 may be formed by one or more etching processes. For example, an anisotropic etching process may be used to form the opening 18. Of course, the appropriate etchant gases would have to be used to remove the process layers 16, 14. In one illustrative embodiment, the opening 18 may be approximately 2000 Å wide.

Figure 2:
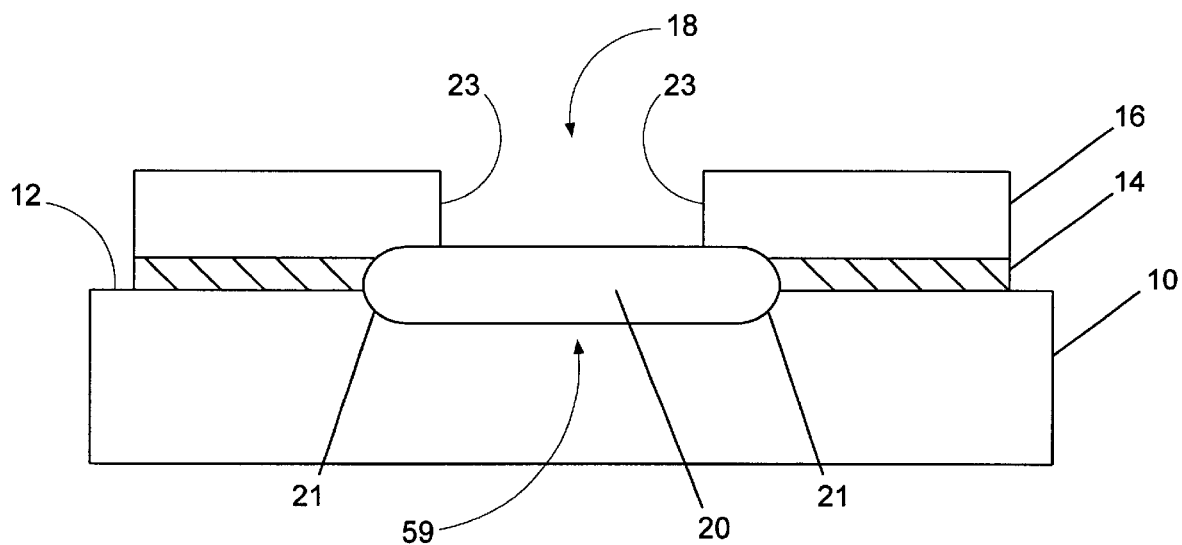
FIG. 2 is a cross-sectional view of the structure shown in FIG. 1 after an oxidation step has been performed.

Next, as shown in FIG. 2, the device is subjected to an oxidation process that results in the formation of a silicon dioxide layer 20. This oxidation may be accomplished by a variety of known methods and techniques. For example, the oxidation may occur in a tube furnace at a temperature of approximately 900–1100° C. for a period of 45–90 minutes. The thickness of the silicon dioxide layer 20 may be varied as a matter of design choice. In one illustrative embodiment, the silicon dioxide layer 20 has a thickness ranging from approximately 500–2500 Å. Of course, although not precisely depicted in the drawings, the thickness of the silicon dioxide layer 20 will be greatest in the middle region 59 of the layer 20 and gradually be reduced in thickness towards ends 21 of the layer 20. Note that, during the course of the growth of the silicon dioxide layer 20, approximately half of the thickness of the silicon dioxide layer 20 is formed below the surface 12 of the semiconducting substrate 10. Additionally, the ends 21 of the silicon dioxide process layer 20 extend under the edges 23 of the process layer 16. In effect, this structure is roughly equivalent to the traditional "bird's beak" structure commonly found in semiconductor processing.

Figure 3:
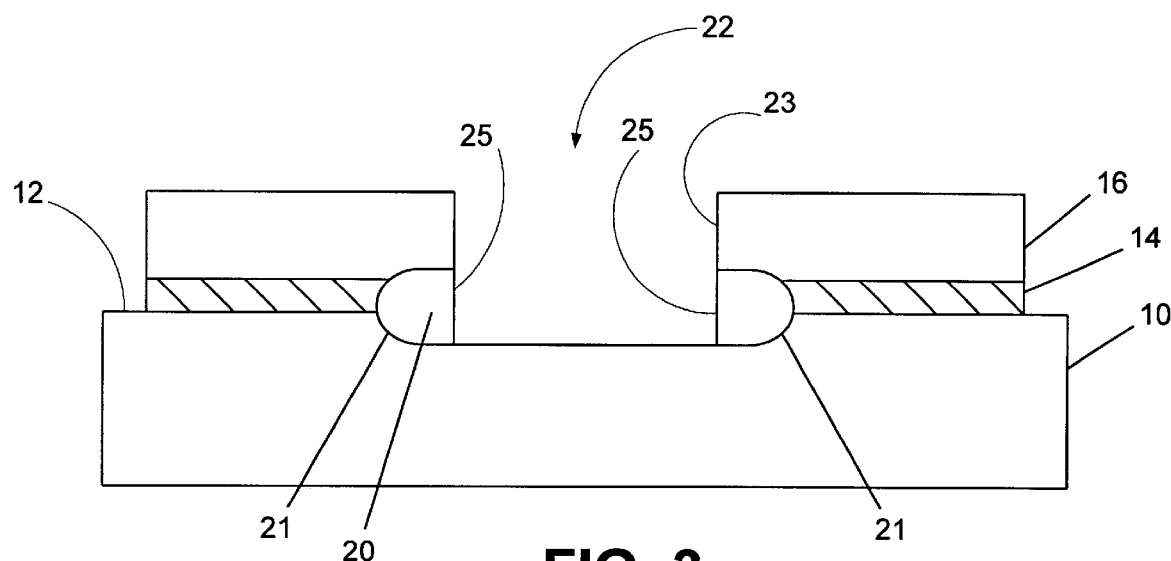
FIG. 3 is a cross-sectional view of the structure shown in FIG. 2 after it has been subjected to an etching process.

Next, as shown in FIG. 3, the structure is subjected to an anisotropic etching process that results in the formation of an opening 22 in the silicon dioxide layer 20 as defined by a plurality of edges 25. This anisotropic etching process may be accomplished using a variety of etchant gases suitable for etching silicon dioxide. For example, $CHF_4$ may be used as the etchant gas.

Figure 4:
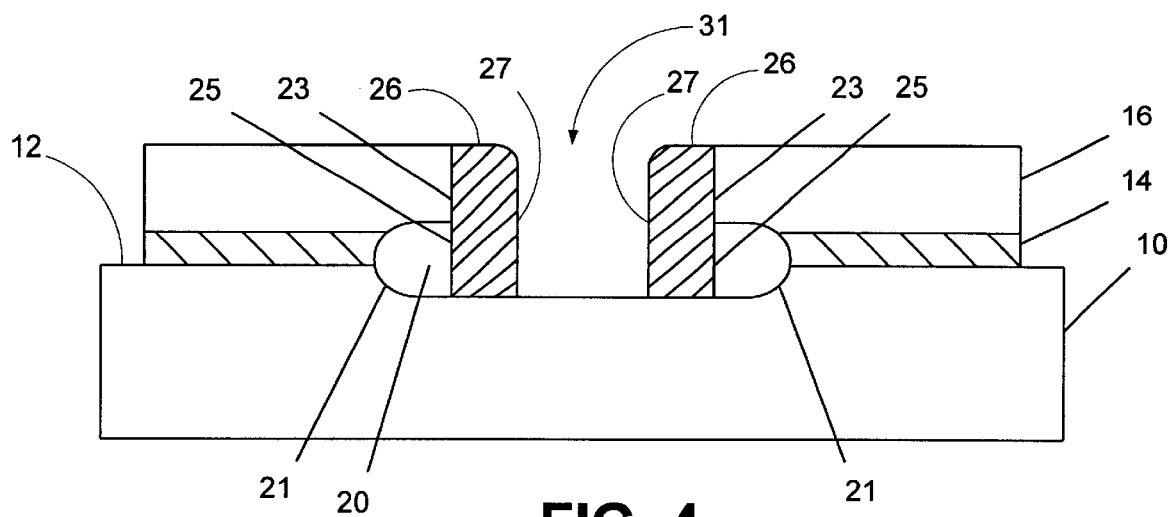
FIG. 4 is a cross-sectional view of the structure shown in FIG. 3 after a plurality of sidewall spacers have been formed in the opening therein.

As shown in FIG. 4, the next process involves the formation of a plurality of sidewall spacers 26 adjacent the edges 25 of the silicon dioxide layer 20 and the edges 23 of the process layer 16. The edges 27 of the spacers 26 define an opening 31 that, as will be apparent to one of ordinary skill in the art upon a complete reading of this disclosure, corresponds to the channel length of the finished transistor, as explained more fully below. The sidewall spacers 26 may be comprised of a variety of materials, such as, for example, silicon dioxide, silicon nitride, silicon oxynitride, etc. Additionally, the sidewall spacers 26 may be formed by a variety of known techniques for forming such spacers. For example, the sidewall spacers 26 may be formed by making a conformal deposition of the appropriate spacer material, e.g., silicon dioxide, silicon nitride, silicon oxynitride, having a thickness ranging from approximately 500–800 Å, or greater, by a chemical vapor deposition process. Thereafter, the layer of sidewall spacer material is subjected to an anisotropic etching process to result in the sidewall spacers 26 depicted in FIG. 4. In one illustrative embodiment, the sidewall spacers 26 are comprised of silicon dioxide having a thickness ranging from approximately 500–800 Å.

As stated previously, the edges 27 of the sidewall spacers 26 will define the channel length of the finished transistor. In the illustrative example where the opening 18 (see FIG. 1) is approximately 2000 Å, and the sidewall spacers 26 have a thickness ranging from approximately 500–800 Å, a transistor having a channel length ranging from approximately 400–1000 Å (0.04–0.10 microns) may be formed. Thus, as will be readily apparent to one skilled in the art, manufacturing a transistor to have a desired channel length requires consideration of the size of the opening 22 formed in the silicon dioxide layer 20 and the width of the sidewall spacers 26 formed in the opening 22.

Figure 5:
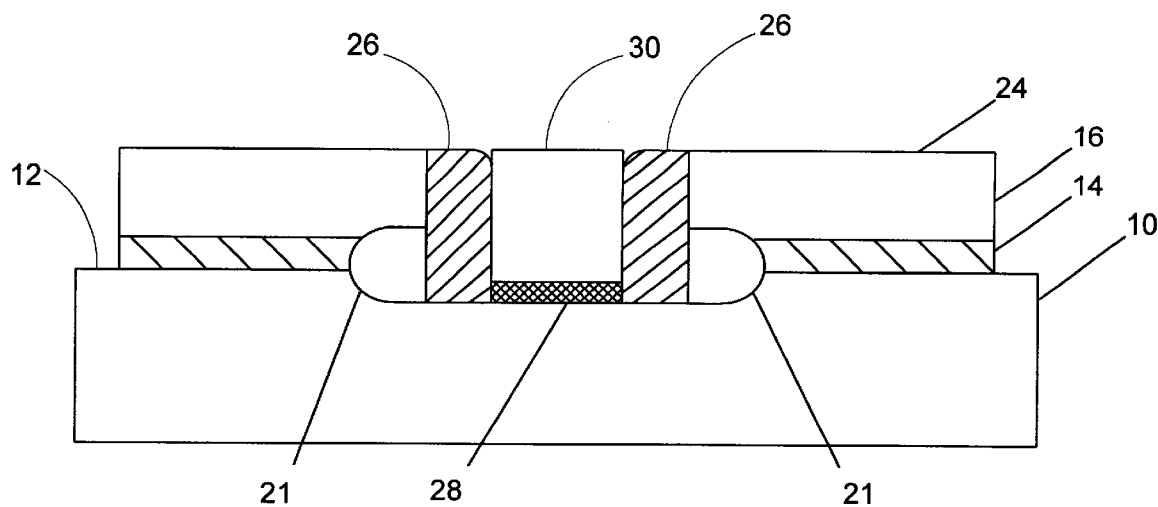
FIG. 5 is a cross-sectional view of the structure shown in FIG. 4 after a gate dielectric and a gate conductor have been formed above the substrate between the spacers.

As shown in FIG. 5, the next process involves formation of a gate dielectric 28 and a gate conductor 30. The gate dielectric 28 may be comprised of a variety of materials, such as, for example, silicon dioxide or a nitrogen-bearing silicon dioxide. The gate dielectric 28 may be formed by a variety of known techniques, such as a rapid thermal anneal process at a temperature of approximately 900–1050° C. for a time of 10–30 seconds, in the presence of nitric oxide (NO)

or nitrous oxide ($N_2O$). The gate dielectric 28 may have a thickness that varies as a matter of design choice. In one illustrative embodiment, the gate dielectric 28 is comprised of a nitrogen-bearing silicon dioxide having a thickness ranging from approximately 15–25 Å.

Thereafter, as shown in FIG. 5, a gate conductor 30 is formed above the gate dielectric 28. The gate conductor 30 may be comprised of a variety of materials, such as polysilicon or a metal, e.g., copper, aluminum, etc., and may be formed by a variety of known techniques, e.g., deposition. Typically, the gate conductor 30 is formed from a process layer comprised of the appropriate conductive material above the surface 24 of the process layer 16, followed by a chemical mechanical polishing operation to remove the excess conductive material and produce the structure shown in FIG. 5.

Figure 6:
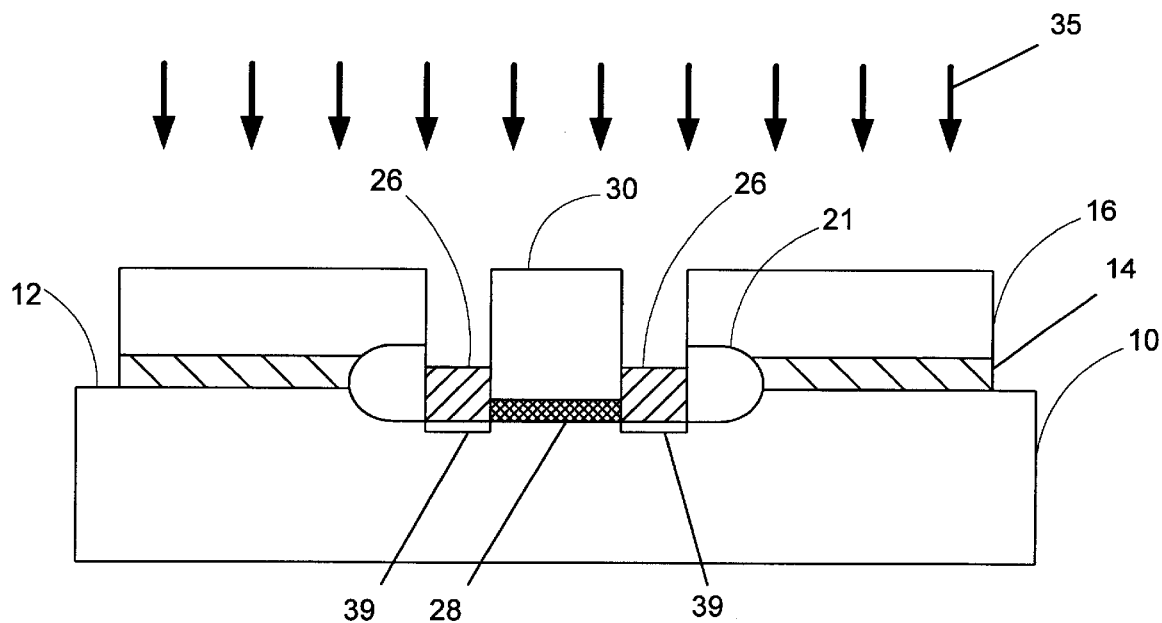
FIG. 6 is a cross-sectional view of the structure shown in FIG. 5 after it has been subjected to an etching process.

Next, an anisotropic etching of the sidewall spacers 26 is performed. In effect, this process acts to reduce the height of the sidewall spacers 26 to approximately 200–500 Å, as shown in FIG. 6. Thereafter, as indicated by arrows 35, the structure is subjected to a light doping ion implantation process to form the doped regions 39 in the substrate 10. As will be understood by one skilled in the art, the doped regions 39 will ultimately become part of the extensions for the source/drain regions for the transistor, as will be explained more fully below. This light doping process may be performed at an ion concentration of approximately $7 \times 10^{14} - 3 \times 10^{15}$ ions/cm$^2$ and at an energy level of approximately 50–300 keV. In the case of NMOS technology, the dopant atoms would be, for example, arsenic.

Figure 7:
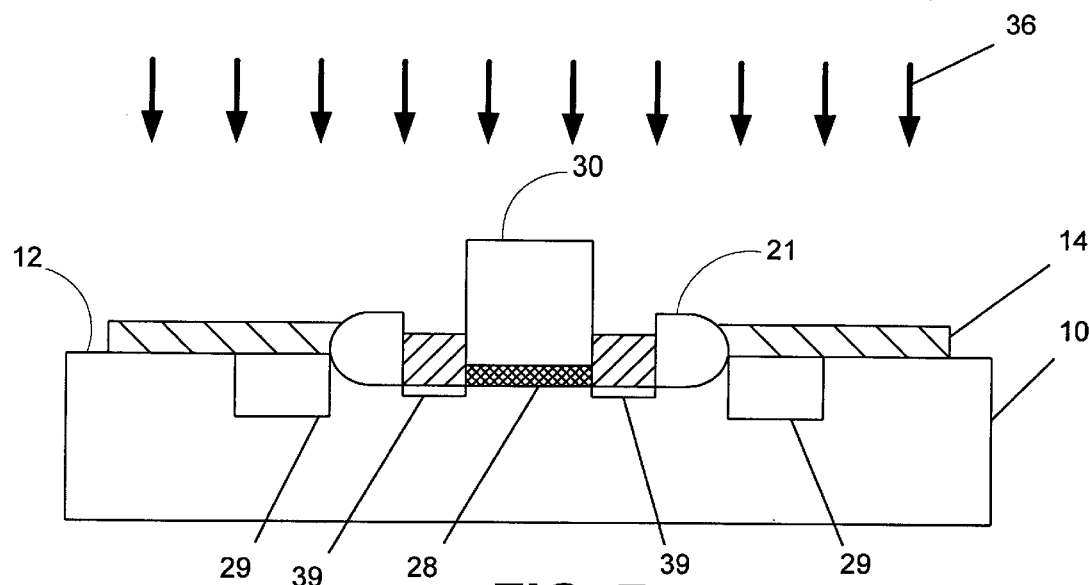
FIG. 7 is a cross-sectional view of the structure shown in FIG. 6 after one of the process layers has been removed.

As shown in FIG. 7, the process layer 16 is then removed by one or more etching processes. For example, in the case where the process layer 16 is comprised of silicon nitride, the etching may be an anisotropic etching process using $CHF_3$ as the etchant gas. Next, as indicated by arrows 36, a second implantation process is performed in which ions at a higher concentration of approximately $3 \times 10^{15} - 8 \times 10^{15}$ ions/cm$^2$ is implanted at an energy level of approximately 5–50 keV to form the regions 29. Alternatively, if desired, the process layer 14 may be removed prior to the second implantation process.

Figure 8:
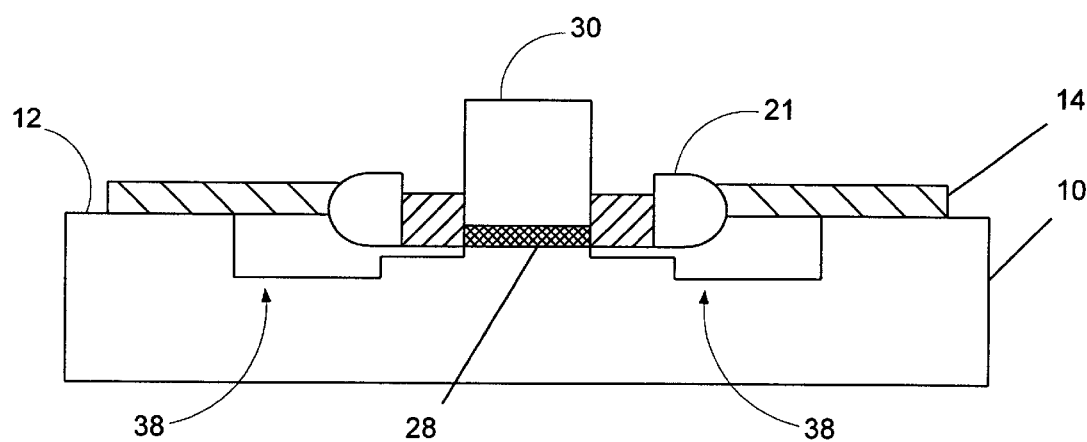
FIG. 8 is a cross-sectional view of the device shown in FIG. 7 after it has been subjected to a heat treating process.

The structure is then subjected to an anneal process. This anneal process may be performed by a variety of known techniques. For example, the anneal may be accomplished by a rapid thermal anneal process at a temperature of approximately 150–1100° C. that is performed for approximately 15–60 seconds. During this anneal process, the doped regions 29 formed as a result of the second implantation process, as indicated by arrows 36, merges with the doped regions 39 formed as the result of the initial implantation process, as indicated by the arrows 35, described above in connection with FIG. 6 to form source/drain regions 38 as shown in FIG. 8.

The next operation to be performed will now be described with reference to FIG. 9. As shown therein, the process layer 14 is removed by any of a variety of known etching processes. Thereafter, sidewall spacers 40 are formed adjacent the gate conductor 30 and gate dielectric 28. The sidewall spacers 40 may be comprised of a variety of known materials, such as silicon dioxide or silicon nitride, and may be formed by a traditional conformal deposition of the appropriate material followed by an anisotropic etch to result in the sidewall spacers 40 depicted in FIG. 9. Although the sidewall spacers 26 are depicted in FIG. 9 as being separate and distinct from the sidewall spacers 40, in practice, the sidewall spacers 26 adjacent the gate dielectric 28, as well as the ends 21 (see FIG. 7) of the silicon dioxide layer 20, may all be combined to constitute the finished sidewall spacers 40.

As an alternative process flow, the second ion implantation process, as indicated by the arrows 36 in FIG. 7, may be performed after the sidewall spacers 40 (shown in FIG. 9) are formed. Thereafter, the device may be subjected to the anneal process described above to merge the regions 29 and 39 together.

Thereafter, the structure may be subjected to a salicidation process involving the use of, for example, titanium or cobalt. For example, as will be apparent to one skilled in the art, a layer 42 comprised of titanium or cobalt or other like materials may be formed above the surface 43 of the source/drain regions 38, the sidewall spacers 40, and the gate conductor 30. Thereafter, the layer 42 is subjected to a heat treating process to form the appropriate salicide. The portion of the process layer 42 in contact with the sidewall spacers 40 will not react and may be removed by a subsequent acid rinse known to those skilled in the art.

Figure 9:
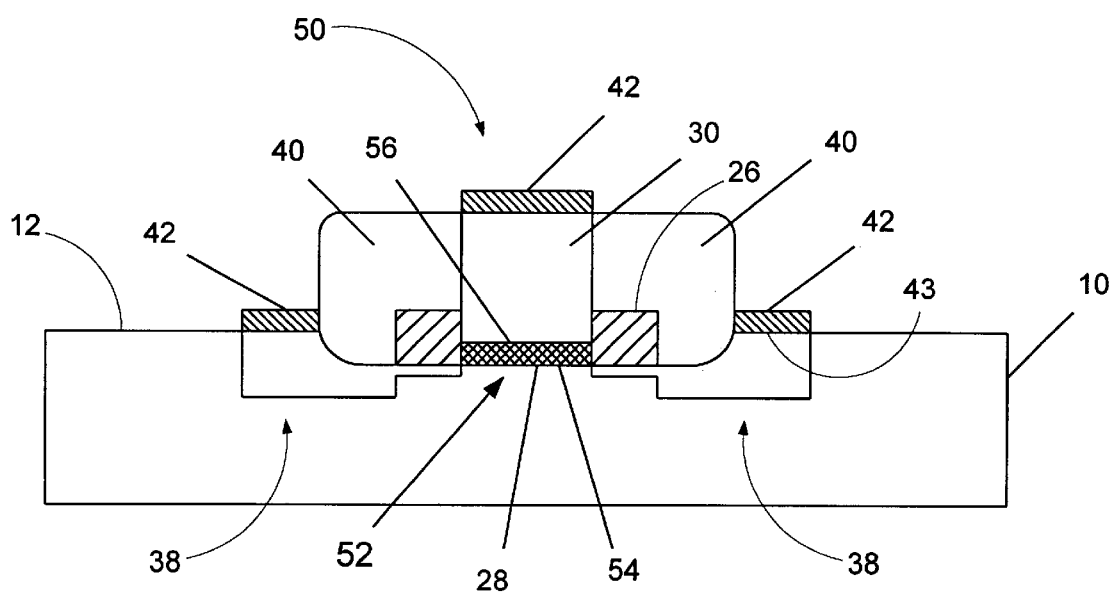
FIG. 9 is a cross-sectional view of the structure shown in FIG. 7 after spacers have been formed adjacent the gate conductor and the structure has been subjected to a salicidation process.

As can be seen in FIG. 9, a transistor 50 is comprised of a gate dielectric 28, a gate conductor 30, a plurality of sidewall spacers 40, and a plurality of source/drain regions 38. A recess 52 is formed in the substrate 10, and the gate dielectric 28 is positioned in the recess 52. The gate dielectric 28 and the substrate 10 lying within the recess 52 define an interface 54 that is positioned below the surface 12 of the substrate 10. The interface 54 may be positioned at depth ranging from approximately 250–1250 Å beneath the surface 12 of the substrate 10. In one illustrative embodiment of the present invention, the gate dielectric 28 has a top surface 56 that is positioned beneath the surface 12 of the substrate 10, i.e., in this embodiment, the gate dielectric 28 is positioned entirely beneath the surface 12 of the substrate 10.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of making a transistor, comprising:
   forming a recess in a semiconducting substrate;
   forming a gate dielectric adjacent said substrate within said recess;
   forming a gate conductor adjacent said gate dielectric;
   forming a plurality of sidewall spacers adjacent at least said gate conductor; and
   forming a plurality of source/drain regions in said substrate.

2. The method of claim 1, wherein forming a recess in a semiconducting substrate comprises forming a first process layer above a semiconducting substrate, said substrate having a surface, forming a second process layer comprised of an oxidation resistant material above said first process layer, patterning said first and second process layers to define a first opening in said first and second process layers, oxidizing the substrate lying within said first opening to form a third process layer comprised of silicon dioxide, and patterning said third process layer to define a second opening.

3. The method of claim 1, wherein forming a gate dielectric adjacent said substrate within said recess comprises forming a gate dielectric adjacent said substrate within said recess, said gate dielectric lying within said recess.

4. The method of claim 1, wherein forming a gate dielectric adjacent said substrate within said recess comprises forming a gate dielectric adjacent said substrate within said recess, said gate dielectric lying partially within said recess.

5. A method of making a transistor, comprising:
   forming a first process layer above a semiconducting substrate, said substrate having a surface;
   forming a second process layer comprised of an oxidation resistant material above said first process layer;
   patterning said first and second process layers to define a first opening in said first and second process layers;
   oxidizing the substrate lying within said first opening to form a third process layer comprised of silicon dioxide;
   patterning said third process layer to define a second opening;
   forming a plurality of sidewall spacers in at least said second opening formed in said third process layer;
   forming a gate dielectric above said surface of said substrate between said sidewall spacers;
   forming a gate conductor above said gate dielectric; and
   forming a plurality of source/drain regions in said substrate.

6. The method of claim 5, wherein said sidewall spacers have a height and wherein the method further comprises reducing the height of said sidewall spacers by an etching process.

7. The method of claim 5, wherein forming a first process layer above a semi-conducting substrate, said substrate having a surface, comprises forming a first process layer comprised of silicon dioxide above a semiconducting substrate, said substrate having a surface.

8. The method of claim 5, wherein forming a first process layer above a semiconducting substrate, said substrate having a surface, comprises forming a first process layer above a semiconducting substrate comprised of silicon, said substrate having a surface.

9. The method of claim 5, wherein forming a second process layer comprised of an oxidation resistant material above said first process layer comprises forming a second process layer comprised of silicon nitride above said first process layer.

10. The method of claim 5, wherein forming a second process layer comprised of an oxidation resistant material above said first process layer comprises depositing a second process layer comprised of an oxidation resistant material above said first process layer.

11. The method of claim 5, wherein patterning said first and second process layers to define a first opening in said first and second process layers comprises etching said first and second process layers to define a first opening in said first and second process layers.

12. The method of claim 5, wherein oxidizing the substrate lying within said first opening to form a third process layer comprised of silicon dioxide comprises performing a heating process at a temperature ranging from approximately 900–1100° C. for a period ranging from approximately 45–90 minutes.

13. The method of claim 5, wherein patterning said third process layer to define a second opening comprises etching said third process layer to define a second opening.

14. The method of claim 5, wherein forming a plurality of sidewall spacers in at least said second opening formed in said third process layer comprises depositing a fourth process layer comprised of a sidewall spacer material, and anisotropically etching said fourth process layer.

15. The method of claim 5, wherein forming a gate dielectric above said surface of said substrate between said sidewall spacers comprises thermally growing a gate dielectric above said surface of said substrate between said sidewall spacers.

16. The method of claim 5, wherein forming a gate dielectric above said surface of said substrate between said sidewall spacers comprises forming a gate dielectric comprised of silicon dioxide or a nitrogen-bearing silicon dioxide above said surface of said substrate between said sidewall spacers.

17. The method of claim 5, wherein forming a gate conductor above said gate dielectric comprises forming a gate conductor comprised of a doped polysilicon or a metal above said gate dielectric.

18. The method of claim 5, wherein forming a gate conductor above said gate dielectric comprises forming a gate conductor comprised of copper or aluminum above said gate dielectric.

19. The method of claim 5, wherein forming a gate conductor above said gate dielectric comprises depositing a layer of polysilicon or a metal above said gate dielectric and chemically mechanically polishing said layer of polysilicon or a metal.

20. The method of claim 5, wherein forming a plurality of source/drain regions in said substrate comprises:
   performing a first ion implantation process to define a first doped region in said substrate;
   performing a second ion implantation process to define a second doped region in said substrate, said second ion implantation process being at a higher dopant concentration and at a higher energy level than said first ion implantation process; and
   performing a rapid thermal anneal process at a temperature ranging from approximately 150–1100° C. for a time period ranging from approximately 15–60 seconds.

21. A method of making a transistor, comprising:
   forming a first process layer above a semiconducting substrate, said substrate having a surface;
   depositing a second process layer comprised of silicon nitride above said first process layer;
   etching said first and second process layers to define a first opening in said first and second process layers;
   oxidizing the substrate lying within said first opening to form a third process layer comprised of silicon dioxide;
   etching said third process layer to define a second opening;
   forming a plurality of sidewall spacers in at least said second opening formed in said third process layer;
   thermally growing a gate dielectric above said surface of said substrate between said sidewall spacers;
   forming a gate conductor above said gate dielectric; and
   forming a plurality of source/drain regions in said substrate.

22. The method of claim 21, wherein said sidewall spacers have a height and wherein the method further comprises reducing the height of said sidewall spacers by an etching process.

23. The method of claim 21, wherein forming a first process layer above a semiconducting substrate, said substrate having a surface, comprises forming a first process layer comprised of silicon dioxide above a semiconducting substrate, said substrate having a surface.

24. The method of claim 21, wherein forming a first process layer above a semi conducting substrate, said substrate having a surface, comprises forming a first process layer above a semiconducting substrate comprised of silicon, said substrate having a surface.

25. The method of claim 21, wherein oxidizing the substrate lying within said first opening to form a third process layer comprised of silicon dioxide comprises performing a heating process at a temperature ranging from approximately 900–1100° C. for a period ranging from approximately 45–90 minutes.

26. The method of claim 21, wherein forming a plurality of sidewall spacers in at least said second opening formed in said third process layer comprises depositing a fourth process layer comprised of a sidewall spacer material, and anisotropically etching said fourth process layer.

27. The method of claim 21, wherein thermally growing a gate dielectric above said surface of said substrate between said sidewall spacers comprises thermally growing a gate dielectric comprised of silicon dioxide or a nitrogen-bearing silicon dioxide above said surface of said substrate between said sidewall spacers.

28. The method of claim 21, wherein forming a gate conductor above said gate dielectric comprises forming a gate conductor comprised of a doped polysilicon or a metal above said gate dielectric.

29. The method of claim 21, wherein forming a gate conductor above said gate dielectric comprises forming a gate conductor comprised of copper or aluminum above said gate dielectric.

30. The method of claim 21, wherein forming a gate conductor above said gate dielectric comprises depositing a layer of polysilicon or a metal above said gate dielectric and chemically mechanically polishing said layer of polysilicon or a metal.

31. The method of claim 21, wherein forming a plurality of source/drain regions in said substrate comprises:
    performing a first ion implantation process to define a first doped region in said substrate;
    performing a second ion implantation process to define a second doped region in said substrate, said second ion implantation process being at a higher dopant concentration and at a higher energy level than said first ion implantation process; and
    performing a rapid thermal anneal process at a temperature ranging from approximately 150–1100° C. for a time period ranging from approximately 15–60 seconds.

32. A method of making a transistor, comprising:
    forming a first process layer above a semiconducting substrate, said substrate having a first surface;
    forming a second process layer comprised of an oxidation resistant material above said first process layer;
    patterning said first and second process layers to define a first opening in said first and second process layers and to expose said first surface of said substrate within said first opening;
    oxidizing said first surface of said substrate lying within said first opening to form a third process layer comprised of silicon dioxide;
    patterning said third process layer to define a second opening and to expose a second surface of said substrate, said second surface being at a lower level than said first surface of said substrate;
    forming a plurality of sidewall spacers in at least said second opening formed in said third process layer;
    forming a gate dielectric above said second surface of said substrate between said sidewall spacers;
    forming a gate conductor above said gate dielectric; and
    forming a plurality of source/drain regions in said substrate.

33. The method of claim 32, wherein said sidewall spacers have a height and wherein the method further comprises reducing the height of said sidewall spacers by an etching process.

34. The method of claim 32, wherein forming a first process layer above a semiconducting substrate, said substrate having a surface, comprises forming a first process layer comprised of silicon dioxide above a semiconducting substrate, said substrate having a surface.

35. The method of claim 32, wherein forming a first process layer above a semiconducting substrate, said substrate having a first surface, comprises forming a first process layer above a semiconducting substrate comprised of silicon, said substrate having a first surface.

36. The method of claim 32, wherein forming a second process layer comprised of an oxidation resistant material above said first process layer comprises forming a second process layer comprised of silicon nitride above said first process layer.

37. The method of claim 32, wherein forming a second process layer comprised of an oxidation resistant material above said first process layer comprises depositing a second process layer comprised of an oxidation resistant material above said first process layer.

38. The method of claim 32, wherein patterning said first and second process layers to define a first opening in said first and second process layers and to expose said first surface of said substrate within said first opening comprises etching said first and second process layers to define a first opening in said first and second process layers and to expose said first surface of said substrate within said first opening.

39. The method of claim 32, wherein oxidizing said first surface of said substrate lying within said first opening to form a third process layer comprised of silicon dioxide comprises performing a heating process at a temperature ranging from approximately 900–1100° C. for a period ranging from approximately 45–90 minutes.

40. The method of claim 32, wherein patterning said third process layer to define a second opening and to expose a second surface of said substrate, said second surface being at a lower level than said first surface of said substrate comprises etching said third process layer to define a second opening and to expose a second surface of said substrate, said second surface being at a lower level than said first surface of said substrate.

41. The method of claim 32, wherein forming a plurality of sidewall spacers in at least said second opening formed in said third process layer comprises depositing a fourth process layer comprised of a sidewall spacer material, and anisotropically etching said fourth process layer.

42. The method of claim 32, wherein forming a gate dielectric above said second surface of said substrate between said sidewall spacers comprises thermally growing a gate dielectric above said surface of said substrate between said sidewall spacers.

43. The method of claim 32, wherein forming a gate dielectric above said second surface of said substrate between said sidewall spacers comprises forming a gate dielectric comprised of silicon dioxide or a nitrogen-bearing silicon dioxide above said second surface of said substrate between said sidewall spacers.

44. The method of claim 32, wherein forming a gate conductor above said gate dielectric comprises forming a gate conductor comprised of a doped polysilicon or a metal above said gate dielectric.

45. The method of claim 32, wherein forming a gate conductor above said gate dielectric comprises forming a gate conductor comprised of copper or aluminum above said gate dielectric.

46. The method of claim 32, wherein forming a gate conductor above said gate dielectric comprises depositing a layer of polysilicon or a metal above said gate dielectric and chemically mechanically polishing said layer of polysilicon or a metal.

47. The method of claim 32, wherein forming a plurality of source/drain regions in said substrate comprises:

performing a first ion implantation process to define a first doped region in said substrate;

performing a second ion implantation process to define a second doped region in said substrate, said second ion implantation process being at a higher dopant concentration and at a higher energy level than said first ion implantation process; and performing a rapid thermal anneal process at a temperature ranging from approximately 150–1100° C. for a time period ranging from approximately 15–60 seconds.

48. A method of making a transistor, comprising:

forming a first process layer above a semiconducting substrate, said substrate having a first surface;

depositing a second process layer comprised of silicon nitride above said first process layer;

etching said first and second process layers to define a first opening in said first and second process layers and to expose said first surface of said substrate within said first opening;

oxidizing said first surface of said substrate lying within said first opening to form a third process layer comprised of silicon dioxide;

etching said third process layer to define a second opening and to expose a second surface of said substrate, said second surface being at a lower level than said first surface of said substrate;

forming a plurality of sidewall spacers in at least said second opening formed in said third process layer;

thermally growing a gate dielectric above said second surface of said substrate between said sidewall spacers;

forming a gate conductor above said gate dielectric; and forming a plurality of source/drain regions in said substrate.

49. The method of claim 48, wherein said sidewall spacers have a height and wherein the method further comprises reducing the height of said sidewall spacers by an etching process.

50. The method of claim 48, wherein forming a first process layer above a semiconducting substrate, said substrate having a first surface, comprises forming a first process layer comprised of silicon dioxide above a semiconducting substrate, said substrate having a first surface.

51. The method of claim 48, wherein forming a first process layer above a semiconducting substrate, said substrate having a first surface, comprises forming a first process layer above a semiconducting substrate comprised of silicon, said substrate having a first surface.

52. The method of claim 48, wherein oxidizing said first surface of said substrate lying within said first opening to form a third process layer comprised of silicon dioxide comprises performing a heating process at a temperature ranging from approximately 900–1100° C. for a period ranging from approximately 45–90 minutes.

53. The method of claim 48, wherein forming a plurality of sidewall spacers in at least said second opening formed in said third process layer comprises depositing a fourth process layer comprised of a sidewall spacer material, and anisotropically etching said fourth process layer.

54. The method of claim 48, wherein thermally growing a gate dielectric above said second surface of said substrate between said sidewall spacers comprises thermally growing a gate dielectric comprised of silicon dioxide or a nitrogen-bearing silicon dioxide above said second surface of said substrate between said sidewall spacers.

55. The method of claim 48, wherein forming a gate conductor above said gate dielectric comprises forming a gate conductor comprised of a doped polysilicon or a metal above said gate dielectric.

56. The method of claim 48, wherein forming a gate conductor above said gate dielectric comprises forming a gate conductor comprised of copper or aluminum above said gate dielectric.

57. The method of claim 48, wherein forming a gate conductor above said gate dielectric comprises depositing a layer of polysilicon or a metal above said gate dielectric and chemically mechanically polishing said layer of polysilicon or a metal.

58. The method of claim 48, wherein forming a plurality of source/drain regions in said substrate comprises:

performing a first ion implantation process to define a first doped region in said substrate;

performing a second ion implantation process to define a second doped region in said substrate, said second ion implantation process being at a higher dopant concentration and at a higher energy level than said first ion implantation process; and performing a rapid thermal anneal process at a temperature ranging from approximately 150–1100° C. for a time period ranging from approximately 15–60 seconds.

* * * * *